US012743949B1

(12) United States Patent
Zhou

(10) Patent No.: US 12,743,949 B1
(45) Date of Patent: Sep. 22, 2026

(54) MULTI-POINT RECEPTION AND FLEXIBLY DEPLOYABLE DOORBELL CONTROL SYSTEM

(71) Applicant: Bingqian Zhou, Guangdong (CN)

(72) Inventor: Bingqian Zhou, Guangdong (CN)

( * ) Notice: Subject to any disclaimer, the term of this patent is extended or adjusted under 35 U.S.C. 154(b) by 0 days.

(21) Appl. No.: 19/279,607

(22) Filed: Jul. 24, 2025

(51) Int. Cl.

| | |
|---|---|
| ***G08B 3/00*** | (2006.01) |
| ***G08C 17/02*** | (2006.01) |
| ***H02J 1/00*** | (2006.01) |
| ***H03K 17/56*** | (2006.01) |
| ***H04B 1/40*** | (2015.01) |

(52) U.S. Cl.
CPC ................ *G08C 17/02* (2013.01); *H02J 1/00* (2013.01); *H03K 17/56* (2013.01); *H04B 1/40* (2013.01)

(58) Field of Classification Search
CPC ........... G08C 17/02; H02J 1/00; H03K 17/56; H04B 1/40
USPC ............... 340/328, 329, 286.01, 286.02, 500
See application file for complete search history.

(56) References Cited

U.S. PATENT DOCUMENTS

| | | | | |
|---|---|---|---|---|
| 5,666,428 | A * | 9/1997 | Farinelli | H04M 9/08 379/159 |
| 7,023,327 | B1 * | 4/2006 | Chen | G08B 3/10 340/392.5 |
| 11,102,457 | B1 * | 8/2021 | Skeoch | H04N 7/186 |
| 2015/0109111 | A1 * | 4/2015 | Lee | G08B 3/1016 340/328 |
| 2016/0300476 | A1 * | 10/2016 | Kasmir | H04N 7/186 |
| 2022/0237993 | A1 * | 7/2022 | Warren | H03K 17/122 |

* cited by examiner

*Primary Examiner* — Anh V La
(74) *Attorney, Agent, or Firm* — Hawaii Patent Services; Nathaniel K. Fedde; Kenton N. Fedde

(57) ABSTRACT

The present disclosure discloses a multi-point reception and flexibly deployable doorbell control system. The present disclosure provides a solution for extending a wired doorbell to a wireless doorbell by connecting the voltage sensing line of a wireless transmitting device to the output terminal of the outdoor machine button of the existing wired doorbell system, detecting the voltage signal of the wired doorbell, and transmitting the signal wirelessly to a receiving device. This technical solution features two power supply modes, i.e., AC power and built-in battery, ensuring reliable system operation. The receiver can be plugged into any indoor socket, a plurality of receivers can work simultaneously, and achieves wireless extension without altering the original doorbell system.

20 Claims, 6 Drawing Sheets

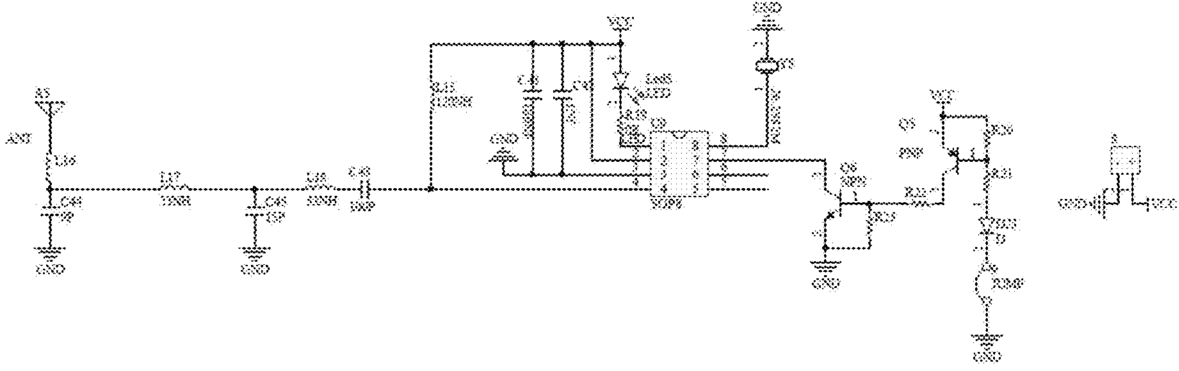
FIG. 3
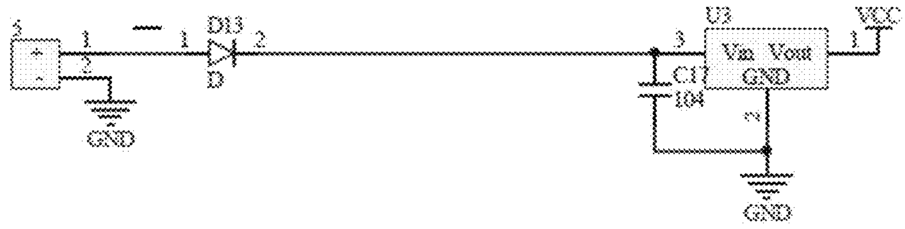
FIG. 4
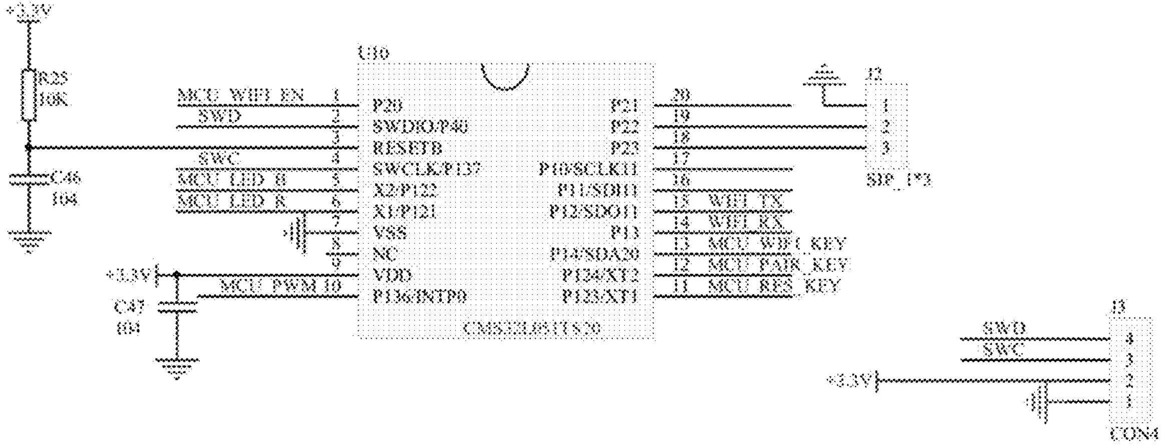
FIG. 5
FIG. 6

MULTI-POINT RECEPTION AND FLEXIBLY DEPLOYABLE DOORBELL CONTROL SYSTEM

TECHNICAL FIELD

The present disclosure belongs to the technical field of doorbell control and particularly relates to a multi-point reception and flexibly deployable doorbell control system.

BACKGROUND

Existing wired doorbells typically use physical wiring connections, which have poor scalability and generally support only 1-2 indoor receiving devices, making it difficult to cover large households or multi-room application scenarios. Additionally, their wiring is complex, with high installation and maintenance costs, and when the wiring is damaged, the devices become unusable, requiring the entire wiring to be replaced. Wireless doorbells, while avoiding wiring issues, rely on battery power, requiring users to replace batteries periodically, which not only increases the burden of use but may also cause the doorbell to fail due to battery depletion, affecting user experience.

Therefore, in response to the above technical shortcomings, there is an urgent need to design and develop a multi-point reception and flexibly deployable doorbell control system.

SUMMARY

An object of the present disclosure is to provide a multi-point reception and flexibly deployable doorbell control system.

The object of the present disclosure is achieved as follows: the system comprises a transmitting device for triggering, generating, and sending signals, and at least one receiving device for receiving the signals generated by the transmitting device; and the transmitting device is a wireless transmitting device.

Further, the wireless transmitting device comprises: a signal detection module, and a wireless transmitting module and a dual power supply module electrically connected to the signal detection module;

- the signal detection module is connected to an output terminal of an outdoor machine button of an existing doorbell system through a voltage sensing line; and
- the wireless transmitting module is internally equipped with a main control chip, a crystal oscillator, and an antenna and RF tuning circuit; and
- the dual power supply module is internally provided with a DC power supply interface and an AC power supply interface respectively.

Further, the DC power supply interface and the AC power supply interface are configured for trigger-controlled switching between two power supply modes through an internally installed power management circuit.

Further, the receiving device is configured as a socket-type structure.

Further, the system further comprises an AC/DC power supply switchable control circuit, the control circuit is respectively equipped with a first control circuit for controlling trigger signal transmission and a second control circuit electrically connected to the first control circuit for AC/DC power supply control.

Further, the first control circuit is equipped with a first control chip; and

- a first pin of the first control chip is connected to one end of a second resistor; the other end of the second resistor is connected to a negative electrode of a first light-emitting diode; a positive electrode of the first light-emitting diode is respectively connected to one end of a first inductor, one end of a fourth capacitor, one end of a fifth capacitor, a second pin of the first control chip, and a power terminal; and
- a fourth pin of the first control chip is respectively connected to the other end of the first inductor and one end of a sixth capacitor; the other end of the sixth capacitor is connected to one end of a fourth inductor; and
- the other end of the fourth inductor is connected to one end of an eighth capacitor and one end of a third inductor; the other end of the third inductor is connected to a seventh capacitor and one end of a second inductor; the other end of the second inductor is connected to an antenna terminal; and
- an eighth pin of the first control chip is connected to one end of a first crystal oscillator; and
- a third pin of the first control chip, the other end of the fourth capacitor, the other end of the fifth capacitor, the other end of the eighth capacitor, the other end of the seventh capacitor, and the other end of the first crystal oscillator are all grounded.

Further, the first control circuit is electrically connected to the second control circuit through a seventh pin of the first control chip; and

- the second control circuit is provided with a first transistor; a collecting electrode of the first transistor is connected to the seventh pin of the first control chip; and
- a base electrode of the first transistor is respectively connected to one end of a third resistor, one end of a fourth resistor, and one end of a seventh resistor; and
- the other end of the third resistor is connected to a collecting electrode of the second transistor; an emitting electrode of the second transistor is respectively connected to the power terminal and one end of a fifth resistor; and
- a base electrode of the second transistor is connected to the other end of the fifth resistor and one end of a sixth resistor respectively; the other end of the sixth resistor is connected to an anode of a fifth diode; a negative electrode of the fifth diode is connected to a first interface of a first toggle switch; and
- a third interface of the first toggle switch is connected to an anode of a sixth diode;
- a negative electrode of the sixth diode is respectively connected to one end of a ninth capacitor and the other end of the seventh resistor; and
- the other end of the ninth capacitor, an emitting electrode of the first transistor, and the other end of the fourth resistor are all grounded.

Further, a model number of the first control chip is CMT2150L.

Further, the system further comprises an AC power control circuit, the control circuit is provided with a third control circuit for controlling trigger signal transmission and a fourth control circuit electrically connected to the third control circuit for AC power control.

Further, the third control circuit is provided with a ninth control chip; and

- a first pin of the ninth control chip is connected to one end of a nineteenth resistor; the other end of the nineteenth resistor is connected to a negative electrode of a fifth light-emitting diode; a positive electrode of the fifth light-emitting diode is connected to one end of a fifteenth inductor, one end of a forty-first capacitor, one end of a forty-second capacitor, a second pin of the ninth control chip, and a power terminal, respectively; and a fourth pin of the ninth control chip is connected to the other end of the fifteenth inductor and one end of a forty-third capacitor, respectively; the other end of the forty-third capacitor is connected to one end of an eighteenth inductor; and the other end of the eighteenth inductor is connected to one end of a forty-fifth capacitor and one end of a seventeenth inductor, respectively; the other end of the seventeenth inductor is connected to a forty-fourth capacitor and one end of a sixteenth inductor respectively; the other end of the sixteenth inductor is connected to an antenna terminal; and an eighth pin of the ninth control chip is connected to one end of a fifth crystal oscillator; and a third pin of the ninth control chip, the other end of the forty-first capacitor, the other end of the forty-second capacitor, the other end of the forty-fifth capacitor, the other end of the forty-fourth capacitor, and the other end of the fifth crystal oscillator are all grounded.

Further, the third control circuit is electrically connected to the fourth control circuit through a seventh pin of the ninth control chip; and the fourth control circuit is provided with a sixth transistor; a collecting electrode of the sixth transistor is connected to a seventh pin of the ninth control chip; and a base electrode of the sixth transistor is connected to one end of a twenty-second resistor and one end of a twenty-third resistor respectively; and the other end of the twenty-second resistor is connected to a collecting electrode of a fifth transistor; an emitting electrode of the fifth transistor is connected to the power terminal and one end of a twentieth resistor respectively; and a base electrode of the fifth transistor is connected to the other end of the twentieth resistor and one end of the twenty-first resistor respectively; the other end of the twenty-first resistor is connected to an anode of a twenty-third diode; a negative electrode of the twenty-third diode is connected to a conductive contact wire; and an emitting electrode of the sixth transistor and the other end of the twenty-third resistor are both grounded.

Further, a model number of the ninth control chip is CMT2150L.

Further, the system further comprises a DC power control circuit, wherein the control circuit is provided with a fifth control circuit for controlling trigger signal transmission and a sixth control circuit electrically connected to the fifth control circuit for DC power control.

Further, the fifth control circuit is provided with a fifth control chip; and a first pin of the fifth control chip is connected to one end of a thirteenth resistor; the other end of the thirteenth resistor is connected to a negative electrode of a fourth light-emitting diode; a positive electrode of the fourth light-emitting diode is respectively connected to one end of an eighth inductor, one end of a twenty-second capacitor, one end of a twenty-third capacitor, a second pin of the fifth control chip, and a power terminal; and a fourth pin of the fifth control chip is connected to the other end of the eighth inductor and one end of a twenty-fifth capacitor; the other end of the twenty-fifth capacitor is connected to one end of the thirteenth inductor; and the other end of the thirteenth inductor is connected to one end of a twenty-ninth capacitor and one end of a twelfth inductor; the other end of the twelfth inductor is connected to a twenty-eighth capacitor and an antenna terminal; and an eighth pin of the fifth control chip is connected to one end of a fourth crystal oscillator; and a third pin of the fifth control chip, the other end of the twenty-second capacitor, the other end of the twenty-third capacitor, the other end of the twenty-ninth capacitor, the other end of the twenty-eighth capacitor, and the other end of the fourth crystal oscillator are all grounded.

Further, the fifth control circuit is electrically connected to the sixth control circuit through a seventh pin of the fifth control chip; and the sixth control circuit is equipped with series-connected sixteenth and seventeenth diodes; and the seventh pin of the fifth control chip is connected to an anode of the sixteenth diode; a negative electrode of the sixteenth diode is connected to an anode of the seventeenth diode; and a negative electrode of the seventeenth diode is connected to a conductive contact wire.

Further, a model number of the fifth control chip is CMT2150L.

Further, the system further comprising a 12V DC power control circuit, wherein the control circuit is a step-down control circuit; the control circuit is equipped with a third control chip, and a first pin of the third control chip is connected to the power terminal; and a third pin of the third control chip is connected to one end of a seventeenth capacitor and a negative electrode of a thirteenth diode; a positive electrode of the thirteenth diode is connected to a positive electrode of a 12V battery terminal; and a negative electrode of the 12V battery terminal, the other end of the seventeenth capacitor, and a ground terminal of the third control chip are all grounded.

In order to achieve the above object, the present disclosure further provides a main control circuit, wherein the control circuit is applied to a multi-point reception and flexibly deployable doorbell control system; and the control circuit is equipped with a tenth control chip; a third pin of the tenth control chip is connected to one end of a forty-sixth capacitor and one end of a twenty-fifth resistor; and the other end of the twenty-fifth resistor and a ninth pin of the tenth control chip are both connected to the power terminal; a ninth pin of the tenth control chip is also connected to one end of a forty-seventh capacitor; and the other end of the forty-sixth capacitor and the other end of the forty-seventh capacitor are both grounded.

Further, a model number of the tenth control chip is CMS32L051TS20.

In order to achieve the above object, the present disclosure further provides a DC-DC switching control circuit, wherein the control circuit is applied to a multi-point reception and flexibly deployable doorbell control system; and the switching control circuit is equipped with a third switching control chip; a first pin of the third switching control chip is connected to one end of a thirty-seventh capacitor, one end of a thirty-sixth capacitor, a negative electrode of a twenty-second diode, and a negative electrode of an eighteenth diode; and a positive electrode of the eighteenth diode is connected to a negative electrode of a nineteenth diode; a positive electrode of the twenty-second diode is connected to a negative electrode of a twenty-first diode; and a positive electrode of the twenty-first diode, a positive electrode of the nineteenth diode, the other end of the thirty-sixth capacitor, and the other end of the thirty-seventh capacitor are all grounded.

The present disclosure provides a solution for extending a wired doorbell to a wireless one by connecting the voltage sensing line of the wireless transmitting device to the output terminal of the outdoor machine button of the existing wired doorbell system, detecting the voltage signal of the wired doorbell, and transmitting the signal wirelessly to the receiving device. This technical solution features two power supply modes: AC power and built-in battery power, with a switch to toggle between them. When power is out, the battery can be used for operation, while AC power is utilized when available, ensuring reliable system operation. The receiver can be plugged into any indoor socket, supporting a plurality of receivers working simultaneously, thereby achieving wireless extension without altering the original doorbell system.

BRIEF DESCRIPTION OF DRAWINGS

To illustrate the technical solutions in the embodiments of the present disclosure more clearly, the following briefly introduces the accompanying drawings required for describing the embodiments. Obviously, the drawings in the following description are merely some embodiments of the present disclosure. For those of ordinary skill in the art, other drawings can be derived from these without creative effort.

FIG. 3 is a schematic diagram of the AC power control circuit (3V power supply with short-circuit control) in the multi-point reception and flexibly deployable doorbell control system of the present disclosure;

FIG. 4 is a schematic diagram of the DC power control circuit (short-circuit control) in the multi-point reception and flexibly deployable doorbell control system of the present disclosure;

FIG. 5 is a schematic diagram of the 12V DC power control circuit in the multi-point reception and flexibly deployable doorbell control system of the present disclosure;

FIG. 6 is a schematic diagram of the main control circuit in the multi-point reception and flexibly deployable doorbell control system of the present disclosure;

REFERENCE SIGNS

Figure 1:
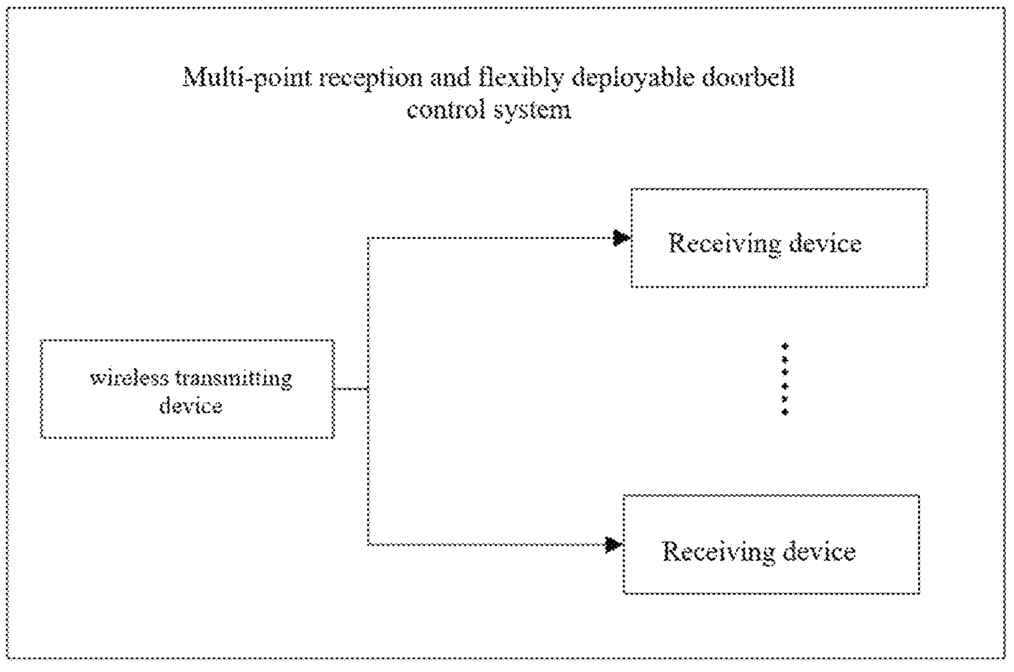
FIG. 1 is a schematic diagram of the framework of a multi-point reception and flexibly deployable doorbell control system according to the present disclosure.
Figure 2:
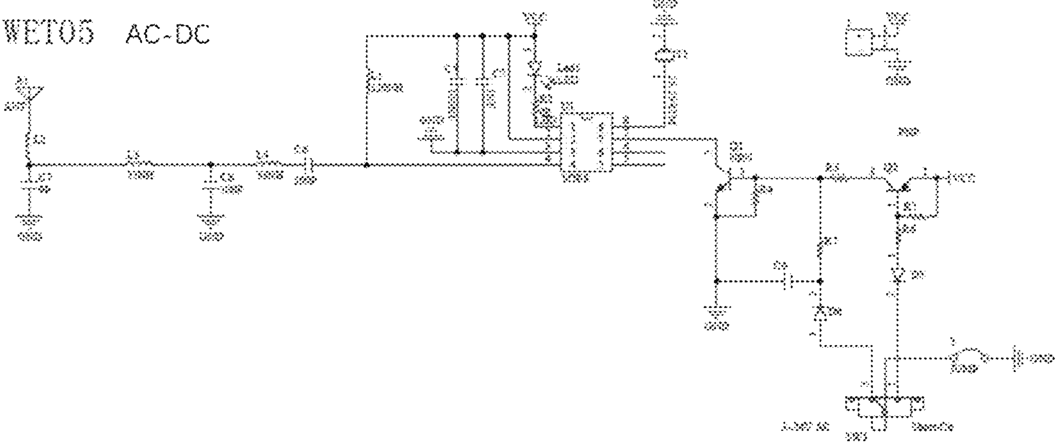
FIG. 2 is a schematic diagram of the switchable AC/DC power control circuit (3V power supply with AC/DC control and short-circuit control, switchable) in the multi-point reception and flexibly deployable doorbell control system of the present disclosure.
Figure 7:
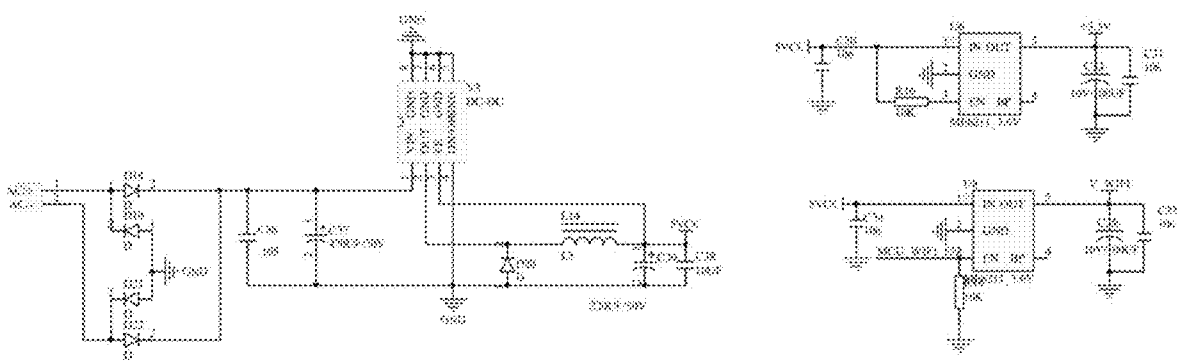
FIG. 7 is a schematic diagram of the AC/DC conversion control circuit in the multi-point reception and flexibly deployable doorbell control system of the present disclosure.
Figure 8:
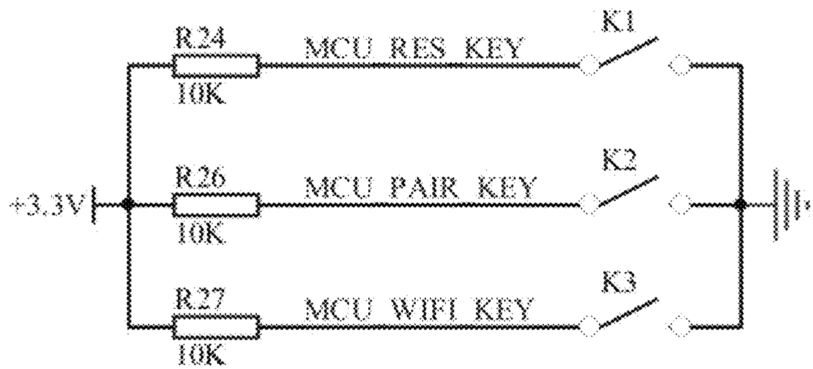
FIG. 8 is a schematic diagram of the switch control circuit for a multi-point reception and flexibly deployable doorbell control system of the present disclosure.
Figure 9:
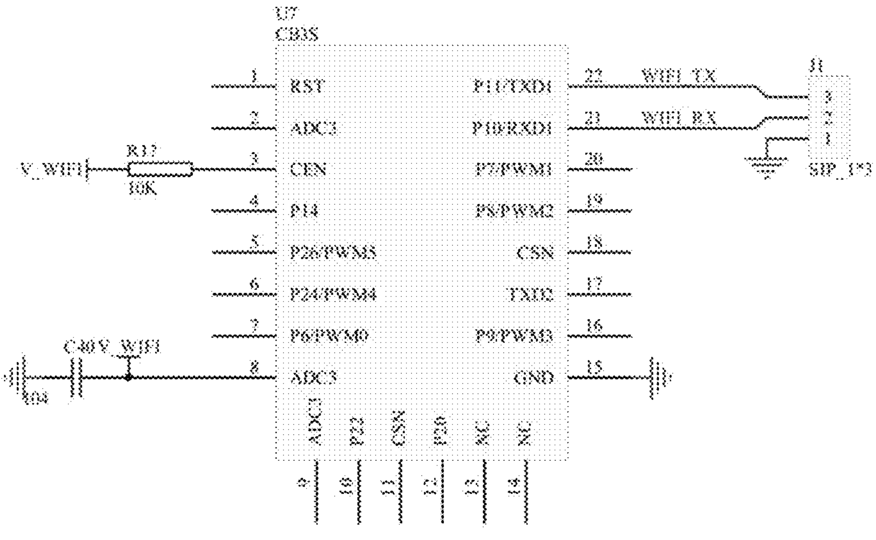
FIG. 9 is a schematic diagram of the WIFI control circuit for a multi-point reception and flexibly deployable doorbell control system of the present disclosure.
Figure 10:
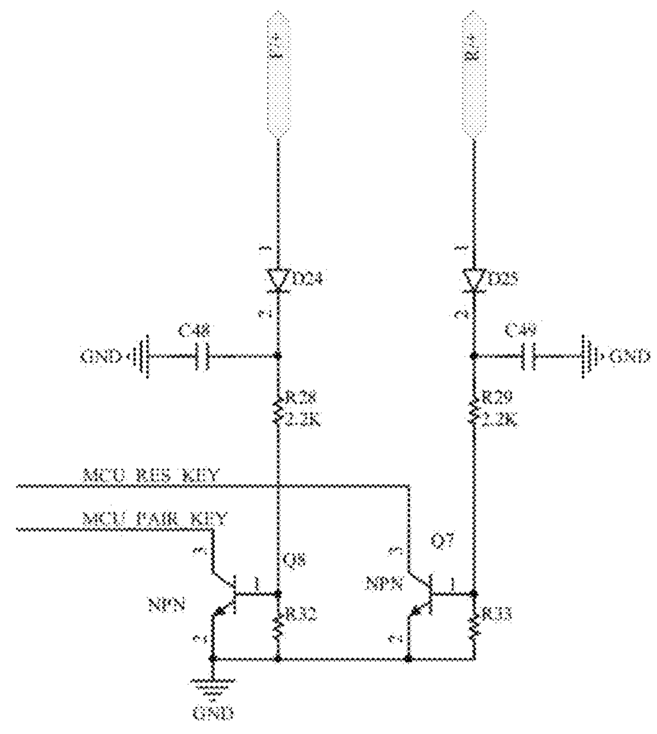
FIG. 10 is a schematic diagram of the door control circuit for a multi-point reception and flexibly deployable doorbell control system of the present disclosure.
Figure 11:
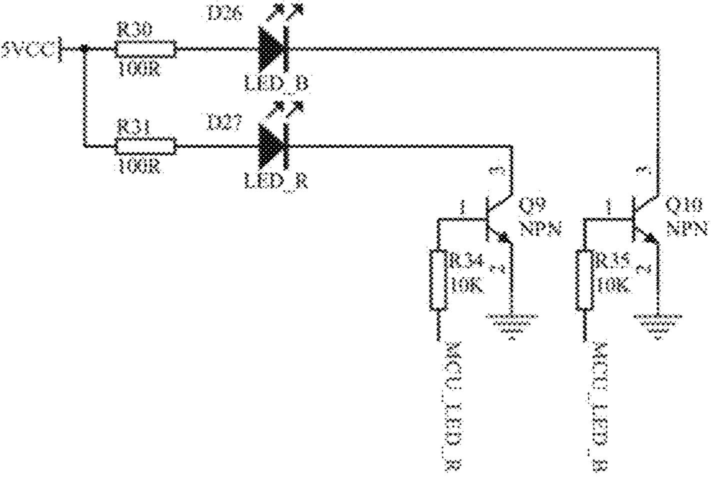
FIG. 11 is a schematic diagram of the LED light control circuit for a multi-point reception and flexibly deployable doorbell control system of the present disclosure.

V2—Second switching control chip; V3—Third switching control chip; U1—First control chip; U2—Second control chip; U3—Third control chip; U4—Fourth control chip; U5—Fifth control chip; U6—Sixth control chip; U7—Seventh control chip; U8—Eighth control chip; U9—Ninth control chip; U10—Tenth control chip; R1—First resistor; R2—Second resistor; R3—Third resistor; R4—Fourth resistor; R5—Fifth resistor; R6—Sixth resistor; R7—Seventh resistor; R8—Eighth resistor; R9—Ninth resistor; R10—Tenth resistor; R11—Eleventh resistor; R12—Twelfth resistor; R13—Thirteenth resistor; R14—Fourteenth resistor; R15—Fifteenth resistor; R16—Sixteenth resistor; R17—Seventeenth resistor; R18—Eighteenth resistor; R19—Nineteenth resistor; R20—Twentieth resistor; R21—Twenty-first resistor; R22—Twenty-second resistor; R23—Twenty-third resistor; R24—Twenty-fourth resistor; R25—Twenty-fifth resistor; R26—Twenty-sixth resistor; R27—Twenty-seventh resistor; R28—Twenty-eighth resistor; R29—Twenty-ninth resistor; R30—Thirtieth resistor; R31—Thirty-first resistor; R32—Thirty-second resistor; R33—Thirty-third resistor; Q1—First transistor; Q2—Second transistor; Q3—Third transistor; Q4—Fourth transistor; Q5—Fifth transistor; Q6—Sixth transistor; Q7—Seventh transistor; Q8—Eighth transistor; Q9—Ninth transistor; Q10—Tenth transistor; D1—First diode; D2—Second diode; D3—Third diode; D4—Fourth diode; D5—Fifth diode; D6—Sixth diode; D7—Seventh diode; D8—Eighth diode; D9—Ninth diode; D10—Tenth diode; D11—Eleventh diode; D12—Twelfth diode; D13—Thirteenth diode; D14—Fourteenth diode; D15—Fifteenth diode; D16—Sixteenth diode; D17—Seventeenth diode; D18—Eighteenth diode; D19—Nineteenth diode; D20—Twentieth diode; D21—Twenty-first diode; D22—Twenty-second diode; D23—Twenty-third diode; D24—Twenty-fourth diode; D25—Twenty-fifth diode; D26—Twenty-sixth diode; D27—Twenty-seventh diode; K1—First switch; K2—Second switch; K3—Third switch; SW1—First toggle switch; Led1—First light-emitting diode; Led2—Second light-emitting diode; L1—First inductor; L2—Second inductor; L3—Third inductor; L4—Fourth inductor; L5—Fifth inductor; L6—Sixth inductor; L7—Seventh inductor; L8—Eighth inductor; L9—Ninth inductor; L10—Tenth inductor; L11—Eleventh inductor; L12—Twelfth inductor; L13—Thirteenth inductor; L14—Fourteenth inductor; L15—Fifteenth inductor; L16—Sixteenth inductor; L17—Seventeenth inductor; L18—Eighteenth inductor; C1—First capacitor; C2—Second capacitor; C3—Third capacitor; C4—Fourth capacitor; C5—Fifth capacitor; C6—Sixth capacitor; C7—Seventh capacitor; C8—Eighth capacitor; C9—Ninth capacitor; C10—Tenth capacitor; C11—Eleventh capacitor; C12—Twelfth capacitor; C13—Thirteenth capacitor; C14—Fourteenth capacitor; C15—Fifteenth capacitor; C16—Sixteenth capacitor; C17—Seventeenth capacitor; C18—Eighteenth capacitor; C19—Nineteenth capacitor; C20—Twentieth capacitor; C21—Twenty-first capacitor; C22—Twenty-second capacitor; C23—Twenty-third capacitor; C24—Twenty-fourth capacitor; C25—Twenty-fifth capacitor; C26—Twenty-sixth capacitor; C27—Twenty-seventh capacitor; C28—Twenty-eighth capacitor; C29—Twenty-ninth capacitor; C30—Thirtieth capacitor; C31—Thirty-first capacitor; C32—Thirty-second capacitor; C33—Thirty-third capacitor; C34—Thirty-fourth capacitor; C35—Thirty-fifth capacitor; C36—Thirty-sixth capacitor; C37—Thirty-seventh capacitor; C38—Thirty-eighth capacitor; C39—Thirty-ninth capacitor; C40—Fortieth capacitor; C41—Forty-first capacitor; C42—Forty-second capacitor; C43—Forty-third capacitor; C44—Forty-fourth capacitor; C45—Forty-fifth capacitor; C46—Forty-sixth capacitor; C47—Forty-seventh capacitor; C48—Forty-eighth capacitor; C49—Forty-ninth capacitor; Y1—First crystal oscillator; Y2—Second crystal oscillator; Y3—Third crystal oscillator; Y4—Fourth crystal oscillator; Y5—Fifth crystal oscillator.

DESCRIPTION OF EMBODIMENTS

To facilitate a better understanding of the objectives, technical solutions, and advantages of the present disclosure, further elaboration is provided below in conjunction with the accompanying drawings and specific embodiments. Other advantages and effects of the present disclosure can be readily understood by those skilled in the art from the content disclosed in this specification.

The present disclosure can also be implemented or applied through other different specific examples. Various details in this specification can be modified or altered based on different perspectives and applications without departing from the spirit of the present disclosure.

It should be noted that if directional indications (such as up, down, left, right, front, back, etc.) are involved in the embodiments of the present disclosure, these directional indications are only used to explain the relative positional relationships and movements of components under a specific posture (as shown in the drawings). If the specific posture changes, the directional indications will also change accordingly.

Additionally, if descriptions such as "first" or "second" are involved in the embodiments of the present disclosure, these terms are used solely for descriptive purposes and should not be construed as indicating or implying relative importance or implicitly specifying the quantity of the indicated technical features. Thus, features defined as "first" or "second" may explicitly or implicitly include at least one such feature. Furthermore, technical solutions from various embodiments can be combined, provided that such combinations are feasible for those of ordinary skill in the art. If a combination of technical solutions results in contradictions or is unfeasible, it should be considered that such a combination does not exist and is not within the scope of protection claimed by the present disclosure.

The following further elaborates on the present disclosure in conjunction with the accompanying drawings.

As shown in FIGS. 1-14, the present disclosure provides a multi-point reception and flexibly deployable doorbell control system. The system includes a transmitting device for triggering, generating, and sending signals, and at least one receiving device for receiving the signals generated by the transmitting device.

The transmitting device is a wireless transmitting device.

The wireless transmitting device includes: a signal detection module, as well as a wireless transmitting module and a dual power supply module electrically connected to the signal detection module.

The signal detection module is connected to the output terminal of an outdoor machine button of an existing doorbell system through a voltage sensing line.

The wireless transmitting module is equipped with a main control chip, a crystal oscillator, and an antenna and RF tuning circuit.

The dual power supply module is provided with a DC power supply interface and an AC power supply interface, respectively.

The DC power supply interface and the AC power supply interface are connected through an internally installed power management circuit to achieve trigger-controlled switching between the two power supply modes.

The receiving device is configured as a socket-type structure.

To achieve the aforementioned object, the present disclosure also provides an AC/DC power supply switchable control circuit, which is applied to the aforementioned multi-point reception and flexibly deployable doorbell control system.

The control circuit is respectively provided with a first control circuit for controlling the emission of trigger signals, and a second control circuit electrically connected to the first control circuit and controlled by AC/DC power supply.

The first control circuit is provided with a first control chip.

The first pin of the first control chip is connected to one end of a second resistor; the other end of the second resistor is connected to the negative electrode of a first light-emitting diode; the positive electrode of the first light-emitting diode is respectively connected to one end of a first inductor, one end of a fourth capacitor, one end of a fifth capacitor, the second pin of the first control chip, and a power terminal.

The fourth pin of the first control chip is respectively connected to the other end of the first inductor and one end of a sixth capacitor; the other end of the sixth capacitor is connected to one end of a fourth inductor.

The other end of the fourth inductor is respectively connected to one end of an eighth capacitor and one end of a third inductor; the other end of the third inductor is respectively connected to a seventh capacitor and one end of a second inductor; the other end of the second inductor is connected to an antenna terminal.

The eighth pin of the first control chip is connected to one end of a first crystal oscillator.

The third pin of the first control chip, the other end of the fourth capacitor, the other end of the fifth capacitor, the other end of the eighth capacitor, the other end of the seventh capacitor, and the other end of the first crystal oscillator are all grounded.

The first control circuit is electrically connected to the second control circuit through the seventh pin of the first control chip.

The second control circuit is provided with a first transistor; the collecting electrode of the first transistor is connected to the seventh pin of the first control chip.

The base electrode of the first transistor is respectively connected to one end of a third resistor, one end of a fourth resistor, and one end of a seventh resistor.

The other end of the third resistor is connected to the collecting electrode of a second transistor; the emitting electrode of the second transistor is respectively connected to the power terminal and one end of a fifth resistor.

The base electrode of the second transistor is respectively connected to the other end of the fifth resistor and one end of a sixth resistor; the other end of the sixth resistor is connected to the anode of a fifth diode; the negative electrode of the fifth diode is connected to the first interface of a first toggle switch.

The third interface of the first toggle switch is connected to the anode of a sixth diode; the negative electrode of the sixth diode is respectively connected to one end of a ninth capacitor and the other end of the seventh resistor.

The other end of the ninth capacitor, the emitting electrode of the first transistor, and the other end of the fourth resistor are all grounded.

The model number of the first control chip is CMT2150L.

Specifically, in the embodiment of the present disclosure, the product has a built-in 3V battery that selects to short-circuit two leads or input 3-24V AC (5-30V DC) through a toggle switch to emit wireless signals to a wireless doorbell receiver.

To achieve the aforementioned object, the present disclosure also provides an AC power supply control circuit, which is applied to the multi-point reception and flexibly deployable doorbell control system.

The control circuit is respectively provided with a third control circuit for controlling the emission of trigger signals and a fourth control circuit electrically connected to the third control circuit for AC power supply control.

The third control circuit is equipped with a ninth control chip.

The first pin of the ninth control chip is connected to one end of a nineteenth resistor; the other end of the nineteenth resistor is connected to the negative electrode of a fifth light-emitting diode; the positive electrode of the fifth light-emitting diode is respectively connected to one end of a fifteenth inductor, one end of a forty-first capacitor, one end of a forty-second capacitor, the second pin of the ninth control chip, and the power terminal.

The fourth pin of the ninth control chip is respectively connected to the other end of the fifteenth inductor and one end of a forty-third capacitor; the other end of the forty-third capacitor is connected to one end of an eighteenth inductor.

The other end of the eighteenth inductor is respectively connected to one end of a forty-fifth capacitor and one end of a seventeenth inductor; the other end of the seventeenth inductor is respectively connected to a forty-fourth capacitor and one end of a sixteenth inductor; the other end of the sixteenth inductor is connected to the antenna terminal.

The eighth pin of the ninth control chip is connected to one end of a fifth crystal oscillator.

The third pin of the ninth control chip, the other end of the forty-first capacitor, the other end of the forty-second capacitor, the other end of the forty-fifth capacitor, the other end of the forty-fourth capacitor, and the other end of the fifth crystal oscillator are all grounded.

The third control circuit is electrically connected to the fourth control circuit through the seventh pin of the ninth control chip.

The fourth control circuit is equipped with a sixth transistor; the collecting electrode of the sixth transistor is connected to the seventh pin of the ninth control chip.

The base electrode of the sixth transistor is connected to one end of the twenty-second resistor and one end of the twenty-third resistor, respectively;

The other end of the twenty-second resistor is connected to the collecting electrode of the fifth transistor; the emitting electrode of the fifth transistor is connected to the power terminal and one end of the twentieth resistor, respectively;

The base electrode of the fifth transistor is connected to the other end of the twentieth resistor and one end of the twenty-first resistor, respectively; the other end of the twenty-first resistor is connected to the anode of the twenty-third diode; the negative electrode of the twenty-third diode is connected to the conductive contact wire;

The emitting electrode of the sixth transistor and the other end of the twenty-third resistor are both grounded.

The model number of the ninth control chip is CMT2150L.

Specifically, in the embodiment of the present disclosure, the product has a built-in 3V battery that emits wireless signals to the wireless doorbell receiver by short-circuiting two leads.

To achieve the above object, the present disclosure also provides a DC power control circuit, which is applied to the multi-point reception and flexibly deployable doorbell control system.

The control circuit is equipped with a fifth control circuit for controlling the emission of trigger signals and a sixth control circuit electrically connected to the fifth control circuit for DC power control.

The fifth control circuit is equipped with a fifth control chip.

The first pin of the fifth control chip is connected to one end of the thirteenth resistor; the other end of the thirteenth resistor is connected to the negative electrode of the fourth light-emitting diode; the positive electrode of the fourth light-emitting diode is connected to one end of the eighth inductor, one end of the twenty-second capacitor, one end of the twenty-third capacitor, the second pin of the fifth control chip, and the power terminal, respectively;

The fourth pin of the fifth control chip is connected to the other end of the eighth inductor and one end of the twenty-fifth capacitor, respectively; the other end of the twenty-fifth capacitor is connected to one end of the thirteenth inductor;

The other end of the thirteenth inductor is connected to one end of the twenty-ninth capacitor and one end of the twelfth inductor, respectively; the other end of the twelfth inductor is connected to the twenty-eighth capacitor and the antenna terminal, respectively;

The eighth pin of the fifth control chip is connected to one end of the fourth crystal oscillator;

The third pin of the fifth control chip, the other end of the twenty-second capacitor, the other end of the twenty-third capacitor, the other end of the twenty-ninth capacitor, the other end of the twenty-eighth capacitor, and the other end of the fourth crystal oscillator are all grounded.

The fifth control circuit is electrically connected to the sixth control circuit through the seventh pin of the fifth control chip;

The sixth control circuit is equipped with series-connected sixteenth and seventeenth diodes, respectively;

The seventh pin of the fifth control chip is connected to the anode of the sixteenth diode; the negative electrode of the sixteenth diode is connected to the anode of the seventeenth diode; the negative electrode of the seventeenth diode is connected to the conductive contact wire.

The model number of the fifth control chip is CMT2150L.

To achieve the above object, the present disclosure also provides a 12V DC power control circuit, which is applied to the multi-point reception and flexibly deployable doorbell control system.

The control circuit is a step-down control circuit; a third control chip is provided in the control circuit; the first pin of the third control chip is connected to the power terminal.

The third pin of the third control chip is connected to one end of the seventeenth capacitor and the negative electrode of the thirteenth diode, respectively; the positive electrode of the thirteenth diode is connected to the 12V battery terminal positive electrode.

The 12V battery terminal negative electrode, the other end of the seventeenth capacitor, and the ground terminal of the third control chip are all grounded.

Specifically, in the embodiment of the present disclosure, the built-in 12V battery transmits wireless signals to the wireless doorbell receiver by short-circuiting two leads.

To achieve the above object, the present disclosure also provides a main control circuit, which is applied to the multi-point reception and flexibly deployable doorbell control system.

A tenth control chip is provided in the control circuit; the third pin of the tenth control chip is connected to one end of the forty-sixth capacitor and one end of the twenty-fifth resistor, respectively.

The other end of the twenty-fifth resistor and the ninth pin of the tenth control chip are both connected to the power terminal; the ninth pin of the tenth control chip is also connected to one end of the forty-seventh capacitor.

The other end of the forty-sixth capacitor and the other end of the forty-seventh capacitor are both grounded.

The model number of the tenth control chip is CMS32L051TS20.

To achieve the above object, the present disclosure also provides a DC-DC switching control circuit, which is applied to the multi-point reception and flexibly deployable doorbell control system.

A third switching control chip is provided in the switching control circuit; the first pin of the third switching control chip is connected to one end of the thirty-seventh capacitor, one end of the thirty-sixth capacitor, the negative electrode of the twenty-second diode, and the negative electrode of the eighteenth diode, respectively.

The positive electrode of the eighteenth diode is connected to the negative electrode of the nineteenth diode; the positive electrode of the twenty-second diode is connected to the negative electrode of the twenty-first diode.

The positive electrode of the twenty-first diode, the positive electrode of the nineteenth diode, the other end of the thirty-sixth capacitor, and the other end of the thirty-seventh capacitor are all grounded.

To achieve the above object, the present disclosure also provides a switch control circuit, which is applied to the multi-point reception and flexibly deployable doorbell control system;

The control circuit is provided with at least three switches, including a first switch, a second switch, and a third switch; the first switch, the second switch, and the third switch are connected in parallel with each other;

The first switch is connected in series with the twenty-fourth resistor, the second switch is connected in series with the twenty-sixth resistor; the third switch is connected in series with the twenty-seventh resistor.

To achieve the above object, the present disclosure also provides a WIFI control circuit, which is applied to the multi-point reception and flexibly deployable doorbell control system;

The control circuit is provided with a seventh control chip; the third pin of the seventh control chip is connected to one end of the seventeenth resistor; the other end of the seventeenth resistor is connected to the WIFI terminal;

The eighth pin of the eighth control chip is connected to the WIFI terminal and one end of the fortieth capacitor, respectively;

The other end of the fortieth capacitor and the fifteenth pin of the seventh control chip are both grounded.

To achieve the above object, the present disclosure also provides a door control circuit, which is applied to the multi-point reception and flexibly deployable doorbell control system;

The control circuit is provided with an eighth transistor and a seventh transistor; the base electrode of the eighth transistor is connected to one end of the thirty-second resistor and one end of the twenty-eighth resistor, respectively;

The other end of the twenty-eighth resistor is connected to one end of the forty-eighth capacitor and the negative electrode of the twenty-fourth diode, respectively;

The base electrode of the seventh transistor is connected to one end of the thirty-third resistor and one end of the twenty-ninth resistor, respectively;

The other end of the twenty-ninth resistor is connected to one end of the forty-ninth capacitor and the negative electrode of the twenty-fifth diode, respectively;

The other end of the forty-eighth capacitor, the other end of the thirty-second resistor, the emitting electrode of the eighth transistor, the emitting electrode of the seventh transistor, the other end of the thirty-third resistor, and the other end of the forty-ninth capacitor are all grounded.

To achieve the above object, the present disclosure also provides an LED light control circuit, which is applied to the multi-point reception and flexibly deployable doorbell control system;

The control circuit is provided with a ninth transistor and a tenth transistor; the base electrode of the ninth transistor is connected to one end of the thirty-fourth resistor; the base electrode of the tenth transistor is connected to one end of the thirty-fifth resistor, respectively;

The collecting electrode of the ninth transistor is connected to the negative electrode of the twenty-seventh diode; the positive electrode of the twenty-seventh diode is connected to one end of the thirty-first resistor; the other end of the thirty-first resistor is connected to the power terminal and one end of the thirtieth resistor, respectively; the other end of the thirtieth resistor is connected to the positive electrode of the twenty-sixth diode; the negative electrode of the twenty-sixth diode is connected to the collecting electrode of the tenth transistor.

The emitting electrode of the ninth transistor and the emitting electrode of the ninth transistor are both grounded.

Specifically, in the embodiment of the present disclosure, the product can convert the voltage required by the MCU and WIFI through a DC-DC circuit. The network settings are configured using buttons, with LEDs indicating the network status. Visitors can press the doorbell buttons at the front and back doors to notify of their arrival. Upon receiving the signals from the front and back door buttons, the system notifies the mobile app through the configured WIFI network.

Figure 12:
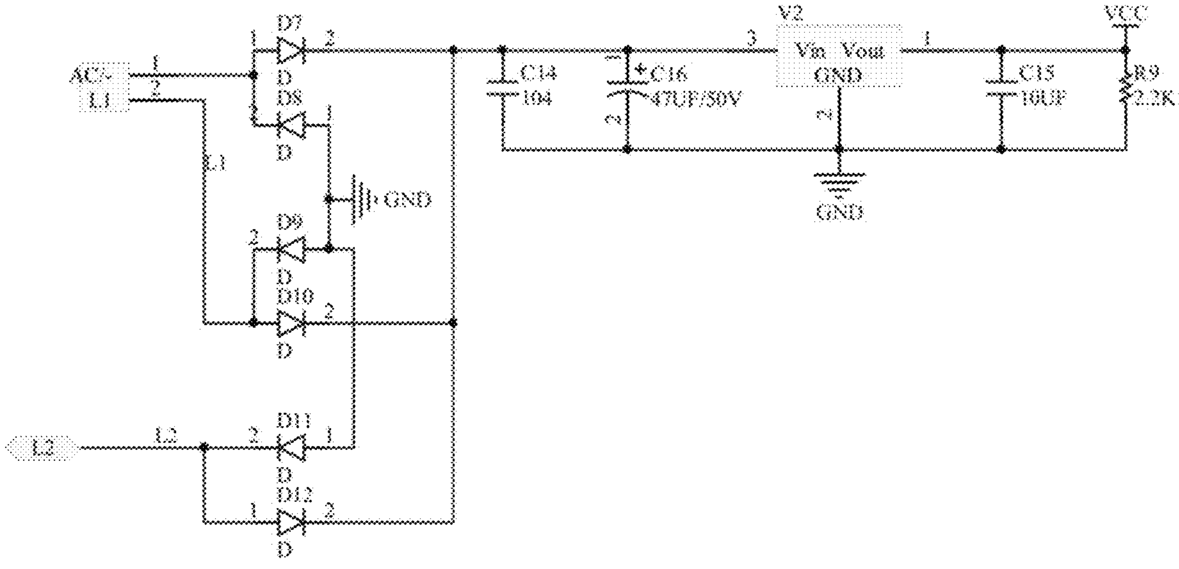
FIG. 12 is a schematic diagram of the AC-DC conversion control circuit II (front and rear door trigger) for a multi-point reception and flexibly deployable doorbell control system of the present disclosure.
Figure 13:
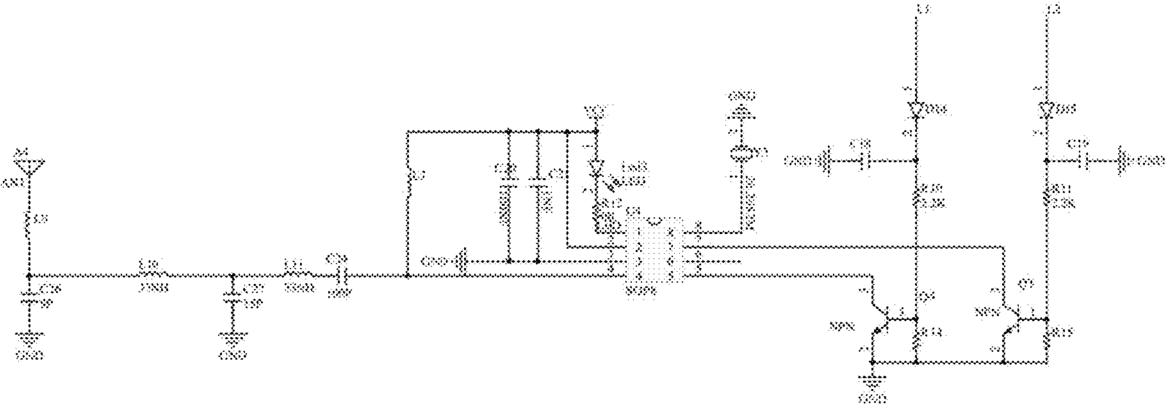
FIG. 13 is a schematic diagram of the door control circuit II (front and rear door trigger) for a multi-point reception and flexibly deployable doorbell control system of the present disclosure.

To achieve the above inventive purpose, the present disclosure also provides a trigger control circuit for front and back doors, as shown in FIGS. 12-13. Specifically, in the embodiment, the product is connected to a 3-24V AC (5-30V DC) power supply to send wireless signals to the wireless doorbell receiver, supporting separate triggering for the front and back doors to indicate the location of the doorbell press.

Figure 14:
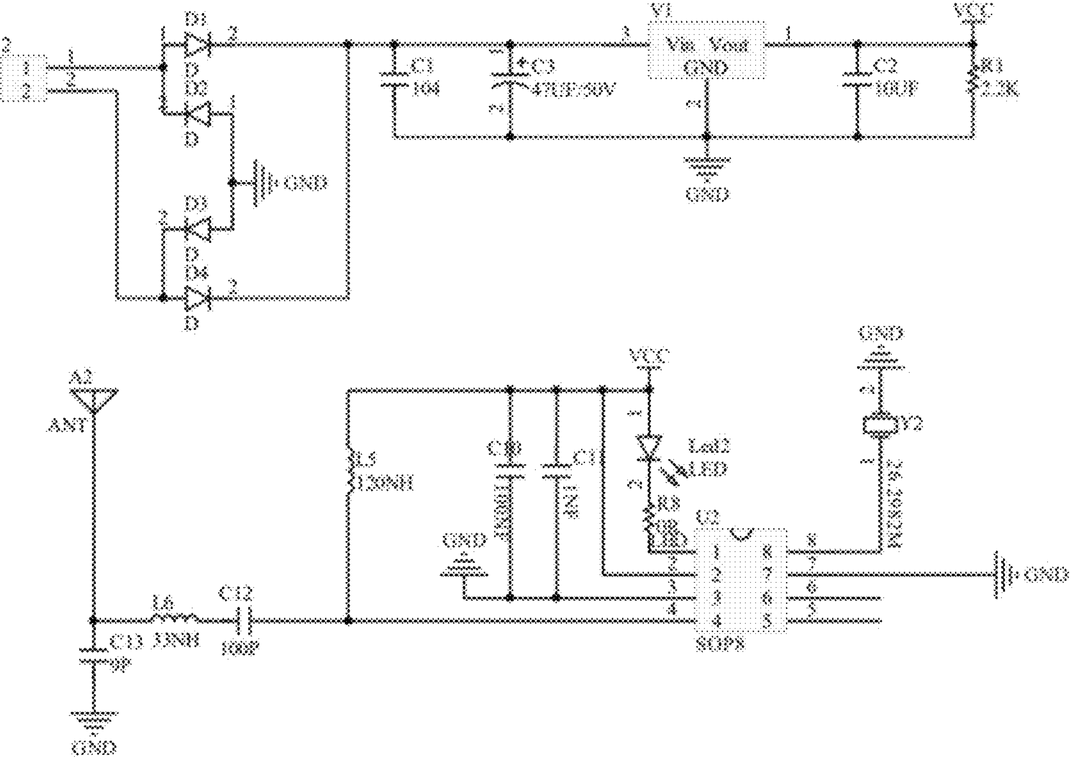
FIG. 14 is a schematic diagram of sending wireless signals for notification to wireless doorbell reception control circuit for AC or DC power supply in a multi-point reception and flexibly deployable doorbell control system of the present disclosure.

To achieve the above inventive purpose, the present disclosure also provides an AC or DC power supply that sends wireless signals to notify the wireless doorbell receiver control circuit, as shown in FIG. 14. Specifically, in the embodiment, the product is connected to a 3-24V AC (5-30V DC) power supply to send wireless signals to the wireless doorbell receiver.

The present disclosure provides a solution for extending a wired doorbell to a wireless one by connecting the voltage sensing line of a wireless transmitting device to the output terminal of the outdoor machine button of the existing wired doorbell system. It detects the voltage signal of the wired doorbell and transmits it wirelessly to the receiving device. This technical solution features two power modes, i.e., AC power and built-in battery power, switchable through a toggle. The battery powers the system during outages, while AC power is used when available, ensuring reliable operation. The receiver can be plugged into any indoor socket, supporting a plurality of receivers working simultaneously, enabling wireless expansion without altering the original doorbell system.

That is to say, the solution provided by the present disclosure offers a method to extend a wired doorbell into a wireless doorbell system, comprising a wireless transmitting device and a receiving device. The wireless transmitting device includes a signal detection module, a wireless transmitting module, and a dual power supply module. The signal detection module is connected through a voltage sensing line to the output terminal of the outdoor machine button of the existing wired doorbell system. The signal detection module is linked to the wireless transmitting module, which consists of a main control chip, a crystal oscillator Y1, an antenna and RF tuning circuit. The dual power supply module includes a 3V DC battery power interface, a 3-24V AC power input interface, and a power toggle switch, enabling the switching between two power supply modes through the power management circuit. The receiving device adopts a plug-in design and can be inserted into any indoor socket, supporting the simultaneous operation of a plurality of receivers.

The embodiments described above only represent several implementations of the present disclosure, and their descriptions are relatively specific and detailed. However, they should not be construed as limiting the scope of the present disclosure. It should be noted that for those skilled in the art, various modifications and improvements can be made without departing from the inventive concept, all of which fall within the protection scope of the present disclosure. Therefore, the protection scope of the present disclosure shall be determined by the appended claims.

What is claimed is:

1. A multi-point reception and flexibly deployable doorbell control system, wherein the system comprises a transmitting device for triggering, generating, and sending signals, and at least one receiving device for receiving the signals generated by the transmitting device;

the transmitting device is a wireless transmitting device configured for detecting and forwarding signals from an existing wired doorbell system, the existing wired doorbell system having an outdoor unit button;

the wireless transmitting device comprises a signal detection module connected to an output terminal of the outdoor unit button of the existing wired doorbell system through a voltage sensing line, such that the wireless transmitting device can detect a voltage signal generated when the outdoor unit button of the existing wired doorbell system is pushed and then transmit a wireless signal to the at least one receiving device; and the at least one receiving device is a wireless receiving device for receiving the wireless signal transmitted by the wireless transmitting device.

2. The multi-point reception and flexibly deployable doorbell control system according to claim 1, wherein the wireless transmitting device comprises a wireless transmitting module and a dual power supply module electrically connected to the signal detection module, wherein:

the wireless transmitting module is internally equipped with a main control chip, a crystal oscillator, and an antenna and RF tuning circuit; and the dual power supply module is internally provided with a DC power supply interface and an AC power supply interface, respectively.

3. The multi-point reception and flexibly deployable doorbell control system according to claim 2, wherein the DC power supply interface and the AC power supply interface are configured for trigger-controlled switching between two power supply modes through an internally installed power management circuit.

4. The multi-point reception and flexibly deployable doorbell control system according to claim 1, wherein the receiving device is configured as a socket-type structure.

5. The multi-point reception and flexibly deployable doorbell control system according to claim 1, further comprising an AC/DC power supply switchable control circuit, the control circuit is respectively equipped with a first control circuit for controlling trigger signal transmission and a second control circuit electrically connected to the first control circuit for AC/DC power supply control.

6. The multi-point reception and flexibly deployable doorbell control system according to claim 1, further comprising an AC power control circuit, the control circuit is provided with a third control circuit for controlling trigger signal transmission and a fourth control circuit electrically connected to the third control circuit for AC power control.

7. The multi-point reception and flexibly deployable doorbell control system according to claim 1, further comprising a DC power control circuit, wherein the control circuit is provided with a fifth control circuit for controlling trigger signal transmission and a sixth control circuit electrically connected to the fifth control circuit for DC power control.

8. The multi-point reception and flexibly deployable doorbell control system according to claim 7, wherein the fifth control circuit is provided with a fifth control chip; and a first pin of the fifth control chip is connected to one end of a thirteenth resistor; the other end of the thirteenth resistor is connected to a negative electrode of a fourth light-emitting diode; a positive electrode of the fourth light-emitting diode is respectively connected to one end of an eighth inductor, one end of a twenty-second capacitor, one end of a twenty-third capacitor, a second pin of the fifth control chip, and a power terminal; and a fourth pin of the fifth control chip is connected to the other end of the eighth inductor and one end of a twenty-fifth capacitor; the other end of the twenty-fifth capacitor is connected to one end of the thirteenth inductor; and the other end of the thirteenth inductor is connected to one end of a twenty-ninth capacitor and one end of a twelfth inductor; the other end of the twelfth inductor is connected to a twenty-eighth capacitor and an antenna terminal; and an eighth pin of the fifth control chip is connected to one end of a fourth crystal oscillator; and a third pin of the fifth control chip, the other end of the twenty-second capacitor, the other end of the twenty-third capacitor, the other end of the twenty-ninth capacitor, the other end of the twenty-eighth capacitor, and the other end of the fourth crystal oscillator are all grounded.

9. The multi-point reception and flexibly deployable doorbell control system according to claim 8, wherein the fifth control circuit is electrically connected to the sixth control circuit through a seventh pin of the fifth control chip; and the sixth control circuit is equipped with series-connected sixteenth and seventeenth diodes; and the seventh pin of the fifth control chip is connected to an anode of the sixteenth diode; a negative electrode of the sixteenth diode is connected to an anode of the seventeenth diode; and a negative electrode of the seventeenth diode is connected to a conductive contact wire.

10. The multi-point reception and flexibly deployable doorbell control system according to claim 9, wherein a model number of the fifth control chip is CMT2150L.

11. The multi-point reception and flexibly deployable doorbell control system according to claim 1, further comprising a 12V DC power control circuit, wherein the control circuit is a step-down control circuit; the control circuit is equipped with a third control chip, and a first pin of the third control chip is connected to a power terminal; and a third pin of the third control chip is connected to one end of a seventeenth capacitor and a negative electrode of a thirteenth diode; a positive electrode of the thirteenth diode is connected to a positive electrode of a 12V battery terminal; and a negative electrode of the 12V battery terminal, the other end of the seventeenth capacitor, and a ground terminal of the third control chip are all grounded.

12. A main control circuit, wherein the control circuit is applied to a multi-point reception and flexibly deployable doorbell control system as described in claim 1; and the control circuit is equipped with a tenth control chip; a third pin of the tenth control chip is connected to one end of a forty-sixth capacitor and one end of a twenty-fifth resistor; and the other end of the twenty-fifth resistor and a ninth pin of the tenth control chip are both connected to a power terminal; a ninth pin of the tenth control chip is also connected to one end of a forty-seventh capacitor; and the other end of the forty-sixth capacitor and the other end of the forty-seventh capacitor are both grounded.

13. The main control circuit according to claim 12, wherein a model number of the tenth control chip is CMS32L051TS20.

14. A DC-DC switching control circuit, wherein the control circuit is applied to a multi-point reception and flexibly deployable doorbell control system as described in claim 1; and the switching control circuit is equipped with a third switching control chip; a first pin of the third switching control chip is connected to one end of a thirty-seventh capacitor, one end of a thirty-sixth capacitor, a negative electrode of a twenty-second diode, and a negative electrode of an eighteenth diode; and a positive electrode of the eighteenth diode is connected to a negative electrode of a nineteenth diode; a positive electrode of the twenty-second diode is connected to a negative electrode of a twenty-first diode; and a positive electrode of the twenty-first diode, a positive electrode of the nineteenth diode, the other end of the thirty-sixth capacitor, and the other end of the thirty-seventh capacitor are all grounded.

15. A multi-point reception and flexibly deployable doorbell control system wherein the system comprises a transmitting device for triggering, generating, and sending signals, and at least one receiving device for receiving the signals generated by the transmitting device;

wherein the transmitting device is a wireless transmitting device;

wherein the system further comprises an AC/DC power supply switchable control circuit, the control circuit is respectively equipped with a first control circuit for controlling trigger signal transmission and a second control circuit electrically connected to the first control circuit for AC/DC power supply control;

wherein the first control circuit is equipped with a first control chip;

wherein a first pin of the first control chip is connected to one end of a second resistor; the other end of the second resistor is connected to a negative electrode of a first light-emitting diode; a positive electrode of the first light-emitting diode is respectively connected to one end of a first inductor, one end of a fourth capacitor, one end of a fifth capacitor, a second pin of the first control chip, and a power terminal;

wherein a fourth pin of the first control chip is respectively connected to the other end of the first inductor and one end of a sixth capacitor; the other end of the sixth capacitor is connected to one end of a fourth inductor;

wherein the other end of the fourth inductor is connected to one end of an eighth capacitor and one end of a third inductor; the other end of the third inductor is connected to a seventh capacitor and one end of a second inductor; the other end of the second inductor is connected to an antenna terminal; and an eighth pin of the first control chip is connected to one end of a first crystal oscillator; and wherein a third pin of the first control chip, the other end of the fourth capacitor, the other end of the fifth capacitor, the other end of the eighth capacitor, the other end of the seventh capacitor, and the other end of the first crystal oscillator are all grounded.

16. The multi-point reception and flexibly deployable doorbell control system according to claim 6, wherein the first control circuit is electrically connected to the second control circuit through a seventh pin of the first control chip; and the second control circuit is provided with a first transistor; a collecting electrode of the first transistor is connected to the seventh pin of the first control chip; and a base electrode of the first transistor is respectively connected to one end of a third resistor, one end of a fourth resistor, and one end of a seventh resistor; and the other end of the third resistor is connected to a collecting electrode of the second transistor; an emitting electrode of the second transistor is respectively connected to the power terminal and one end of a fifth resistor; and a base electrode of the second transistor is connected to the other end of the fifth resistor and one end of a sixth resistor respectively; the other end of the sixth resistor is connected to an anode of a fifth diode; a negative electrode of the fifth diode is connected to a first interface of a first toggle switch; and a third interface of the first toggle switch is connected to an anode of a sixth diode; a negative electrode of the sixth diode is respectively connected to one end of a ninth capacitor and the other end of the seventh resistor; and the other end of the ninth capacitor, an emitting electrode of the first transistor, and the other end of the fourth resistor are all grounded.

17. The multi-point reception and flexibly deployable doorbell control system according to claim 16, wherein a model number of the first control chip is CMT2150L.

18. A multi-point reception and flexibly deployable doorbell control system, wherein the system comprises a transmitting device for triggering, generating, and sending signals, and at least one receiving device for receiving the signals generated by the transmitting device;

wherein the transmitting device is a wireless transmitting device;

wherein the system further comprises an AC power control circuit, the control circuit is provided with a third control circuit for controlling trigger signal transmission and a fourth control circuit electrically connected to the third control circuit for AC power control;

wherein the third control circuit is provided with a ninth control chip;

wherein a first pin of the ninth control chip is connected to one end of a nineteenth resistor; the other end of the nineteenth resistor is connected to a negative electrode of a fifth light-emitting diode; a positive electrode of the fifth light-emitting diode is connected to one end of a fifteenth inductor, one end of a forty-first capacitor, one end of a forty-second capacitor, a second pin of the ninth control chip, and a power terminal, respectively;

wherein a fourth pin of the ninth control chip is connected to the other end of the fifteenth inductor and one end of a forty-third capacitor, respectively; the other end of the forty-third capacitor is connected to one end of an eighteenth inductor;

wherein the other end of the eighteenth inductor is connected to one end of a forty-fifth capacitor and one end of a seventeenth inductor, respectively; the other end of the seventeenth inductor is connected to a forty-fourth capacitor and one end of a sixteenth inductor respectively; the other end of the sixteenth inductor is connected to an antenna terminal;

wherein an eighth pin of the ninth control chip is connected to one end of a fifth crystal oscillator; and wherein a third pin of the ninth control chip, the other end of the forty-first capacitor, the other end of the forty-second capacitor, the other end of the forty-fifth capacitor, the other end of the forty-fourth capacitor, and the other end of the fifth crystal oscillator are all grounded.

19. The multi-point reception and flexibly deployable doorbell control system according to claim 18, wherein the third control circuit is electrically connected to the fourth control circuit through a seventh pin of the ninth control chip; and the fourth control circuit is provided with a sixth transistor; a collecting electrode of the sixth transistor is connected to a seventh pin of the ninth control chip; and a base electrode of the sixth transistor is connected to one end of a twenty-second resistor and one end of a twenty-third resistor respectively; and the other end of the twenty-second resistor is connected to a collecting electrode of a fifth transistor; an emitting electrode of the fifth transistor is connected to the power terminal and one end of a twentieth resistor respectively; and a base electrode of the fifth transistor is connected to the other end of the twentieth resistor and one end of a twenty-first resistor respectively; the other end of the twenty-first resistor is connected to an anode of a twenty-third diode; a negative electrode of the twenty-third diode is connected to a conductive contact wire; and an emitting electrode of the sixth transistor and the other end of the twenty-third resistor are both grounded.

20. The multi-point reception and flexibly deployable doorbell control system according to claim 19, wherein a model number of the ninth control chip is CMT2150L.

* * * * *